(12) United States Patent
Mayer et al.

(10) Patent No.: US 6,586,342 B1
(45) Date of Patent: Jul. 1, 2003

(54) EDGE BEVEL REMOVAL OF COPPER FROM SILICON WAFERS

(75) Inventors: Steven T. Mayer, Lake Oswego, OR (US); Seshasayee Varadarajan, Wilsonville, OR (US); Andrew J. McCutcheon, Oregon City, OR (US)

(73) Assignee: Novellus Systems, Inc., San Jose, CA (US)

(*) Notice: Subject to any disclaimer, the term of this patent is extended or adjusted under 35 U.S.C. 154(b) by 67 days.

(21) Appl. No.: 09/954,728

(22) Filed: Sep. 12, 2001

Related U.S. Application Data

(63) Continuation-in-part of application No. 09/557,668, filed on Apr. 25, 2000, now Pat. No. 6,309,981.

(51) Int. Cl.[7] .............................................. H01L 21/00
(52) U.S. Cl. ............. 438/754; 156/345.17; 156/345.21; 216/92; 216/100; 438/748
(58) Field of Search ................................ 438/692, 693, 438/745, 748, 754; 216/38, 88, 89, 92, 100; 156/345.11, 345.12, 345.17, 345.21

(56) References Cited

U.S. PATENT DOCUMENTS

| | | |
|---|---|---|
| 4,968,375 A | 11/1990 | Sato et al. |
| 5,486,234 A | 1/1996 | Contolini et al. |
| 5,897,379 A | 4/1999 | Ulrich et al. |
| 6,162,739 A | 12/2000 | Sumnitsch et al. |

*Primary Examiner*—William A. Powell
(74) *Attorney, Agent, or Firm*—Beyer Weaver & Thomas, LLP

(57) ABSTRACT

Chemical etching methods and associated modules for performing the removal of metal from the edge bevel region of a semiconductor wafer are described. The methods and systems apply liquid etchant in a precise manner at the edge bevel region of the wafer under viscous flow conditions, so that the etchant is applied on to the front edge area and flows over the side edge and onto the back edge in a viscous manner. The etchant thus does not flow or splatter onto the active circuit region of the wafer. An edge bevel removal embodiment involving that is particularly effective at obviating streaking, narrowing the metal taper and allowing for subsequent chemical mechanical polishing, is disclosed.

27 Claims, 12 Drawing Sheets

TOP VIEW

SIDE VIEW

BOTTOM VIEW

EDGE BEVEL REMOVAL OF COPPER FROM SILICON WAFERS

CROSS-REFERENCE TO RELATED APPLICATIONS

This application claims priority as a continuation-in-part application under 35 U.S.C. §120 from co-pending U.S. patent application Ser. No. 09/557,668, filed Apr. 25, 2000, now U.S. Pat. No. 6,309,981, naming S. Mayer et al. as inventors, and titled "EDGE BEVEL REMOVAL OF COPPER FROM SILICON WAFERS." This application is also related to U.S. patent application Ser. No. 09/557,695 naming Mayer et al. as inventors, and titled "ETCHANT MIXING SYSTEM FOR EDGE BEVEL REMOVAL OF COPPER FROM SILICON WAFERS" and U.S. patent application Ser. No. 09/558,249 naming Mayer et al. as inventors, and titled "WAFER CHUCK FOR USE IN EDGE BEVEL REMOVAL OF COPPER FROM SILICON WAFERS," both filed on Apr. 25, 2000. These patent applications, as well as any patents, patent applications and publication referenced are hereby incorporated by reference in their entireties and for all purposes.

BACKGROUND OF THE INVENTION

This invention relates to technology for removing unwanted metal from semiconductor wafers. More particularly, it pertains to methods for removing unwanted metal, particularly metal in the edge bevel region, using liquid etchants, as well as apparatus modules for performing such removal.

Damascene processing is a method for forming metal lines on integrated circuits. It is often a preferred method because it requires fewer processing steps than other methods and offers a higher yield. In Damascene processing, as well as other integrated circuit manufacturing processes, the conductive routes on the surface of the circuit are generally formed out of a common metal, traditionally aluminum. Copper is a favored metal because of its higher conductivity and electromigration resistance when compared to aluminum, but copper presents special challenges because it readily diffuses into silicon oxide and reduces its electrical resistance at very low doping levels. During integrated circuit fabrication, the conductive metal is needed on the active circuit region of the wafer, i.e., the main interior region on the front side, but is undesirable elsewhere.

In a typical copper Damascene process, the formation of the desired conductive routes generally begins with a thin physical vapor deposition (PVD) of the metal, followed by a thicker electrofill layer (which is formed by electroplating). The PVD process is typically sputtering. In order to maximize the size of the wafer's useable area (sometimes referred to herein as the "active surface region") and thereby maximize the number of integrated circuits produced per wafer), the electrofilled metal must be deposited to very near the edge of the semiconductor wafer. Thus, it is necessary to allow physical vapor deposition of the metal over the entire front side of the wafer. As a byproduct of this process step, PVD metal typically coats the front edge area outside the active circuit region, as well as the side edge, and to some degree, the backside.

Electrofill of the metal is much easier to control, since the electroplating apparatus can be designed to exclude the electroplating solution from undesired areas such as the edge and backside of the wafer. One example of plating apparatus that constrains electroplating solution to the wafer active surface is the SABRE™ clamshell electroplating apparatus available from Novellus Systems, Inc. of San Jose, Calif. and described in U.S. Pat. No. 6,156,167 "CLAMSHELL APPARATUS FOR ELECTROCHEMICALLY TREATING SEMICONDUCTOR WAFERS," by E. Patton et al., and filed Nov. 13, 1997, which is herein incorporated by reference in its entirety.

The PVD metal remaining on the wafer edge after electrofill is undesirable for various reasons. One reason is that PVD metal layers left at the edge after CMP are not suitable for subsequent layer metal deposition on top of them (e.g. subseqent dielectric layer will not adhere well to the PVD copper base layer if it is not removed). Also, the PVD layers are thin and tend to flake off during subsequent handling, thus generating undesirable particles. This can be understood as follows. At the front side edge of the wafer, the wafer surface is beveled. Here the PVD layers are not only thin, but also unevenly deposited. Thus, they do not adhere well. Adhesion of subsequent dielectric layers onto such thin metal is also poor, thus introducing the possibility of even more particle generation. By contrast the PVD metal on the active interior region of the wafer is simply covered with thick, even electrofill metal and planarized by CMP down to the dielectric. This flat surface, which is mostly dielectric, is then covered with a barrier layer substance such as SiN, that both adheres well to the dielectric and aids in the adhesion of subsequent layers. Another reason to remove the residual PVD metal layers in the wafer edge area is that the barrier layers underneath them are also thin and uneven, which may allow migration of the metal into the dielectric. This problem is especially important when the metal is copper.

To address these problems, semiconductor equipment may have to allow etching of the unwanted residual metal layers. Various difficulties will be encountered in designing a suitable etching system.

One of the main difficulties involves the precise application of the etchant to the edge bevel region without allowing it to contact the active circuit region of the wafer. Physical shielding of the active circuit region is an option, but it is undesirable because contacting the wafer in this manner causes particle generation from the surface of the wafer. In addition, it is highly desirable to apply the etchant in a very narrow, confined region at the outer boundary of the wafer, so that the interior active circuit region is defined as expansively as possible. Other difficulties in designing an etching method and system include precise alignment of the wafer on the wafer chuck for rotation, proper pre-wetting, rinsing and drying procedures, and adequate clamping of the wafer in situations where undesired movement is possible. Since backside etching of the wafer is often necessary and desirable at the time of edge bevel removal (EBR), an invention addressing these needs should also be able to perform the back side etch.

Additional problems include the fact that etchant may splash back from the walls of the EBR module, thus causing unwanted oxidation ("streaking") on the wafer surface. Nozzle orifices for dispensing the etchant are difficult to manufacture to precise desired diameters, and any variance in this diameter can result in significantly varying exit velocities from the nozzle. The taper from the region of metalization to the region without metal may also be quite wide, which is undesirable for purposes with respect to subsequent copper removal/planarization steps (e.g. CMP, electropolishing, electroetching).

SUMMARY OF THE INVENTION

The present invention provides chemical etching methods and associated modules for performing the removal of metal from the edge bevel region of a semiconductor wafer, which includes the front side edge, the side edge and the back side. The invention provides methods and systems for applying the etchant in a precise manner at the edge bevel region of the wafer under viscous flow conditions, so that the etchant is applied on to the front edge area and flows over the side edge and onto the back edge in a viscous manner. The etchant thus does not flow or splatter onto the active circuit region of the wafer. An edge bevel removal embodiment that is particularly effective at obviating streaking, narrowing the metal taper and allowing for subsequent chemical mechanical polishing, is disclosed. One aspect of the invention provides a method for removing metal from the edge bevel area of a semiconductor wafer using a prerinse with deionized water and acid, typically in separate operations. Subsequently, an etchant is typically delivered under viscous flow conditions. The metal to be etched may be deposited copper. The invention may allow selective removal of metal at a rate of at least 400 Å per second. Further, the method provides for a liquid etchant delivered onto the edge of the rotating wafer without substantially contacting any region of the wafer inside of the edge bevel area. In a specific embodiment, the nozzle may be positioned so that delivery of the liquid etchant has an angular component in the direction of rotation of the wafer edge (in the direction of the wafer tangent) of about 45 degrees. The nozzle may also be positioned so that delivery of the liquid etchant has a radial component away from the center of the wafer and toward the edge of the wafer of about 25–35 degrees. The wafer may be rotated at about 150–400 rpm, for example about 225 or 350 rpm. Preferably, the method reduces the taper width of the metal at the edge of the wafer to less than about 300 μm.

These and other features and advantages of the present invention will be described in more detail below with reference to the associated drawings.

DETAILED DESCRIPTION OF THE PREFERRED EMBODIMENTS

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

As indicated, this invention pertains to removal of unwanted copper metal from an edge bevel region of a semiconductor Wafer. A "semiconductor wafer" as referred to in this invention is a semiconductor substrate at any of the various states of manufacture in the production of integrated circuits. One standard semiconductor wafer described in this invention is 200 mm in diameter, 0.75 mm thick, with an approximate radius of curvature of about 0.15 millimeters (see SEMI Specification M1-0298). Of course, semiconductor wafers of other dimensions, such as a standard 300 mm diameter silicon wafers, can also be processed in accordance with this invention. Note that standard specifications for a 300 mm diameter wafer may be found in SEMI Specification M1.15-0997.

Figure 1A:
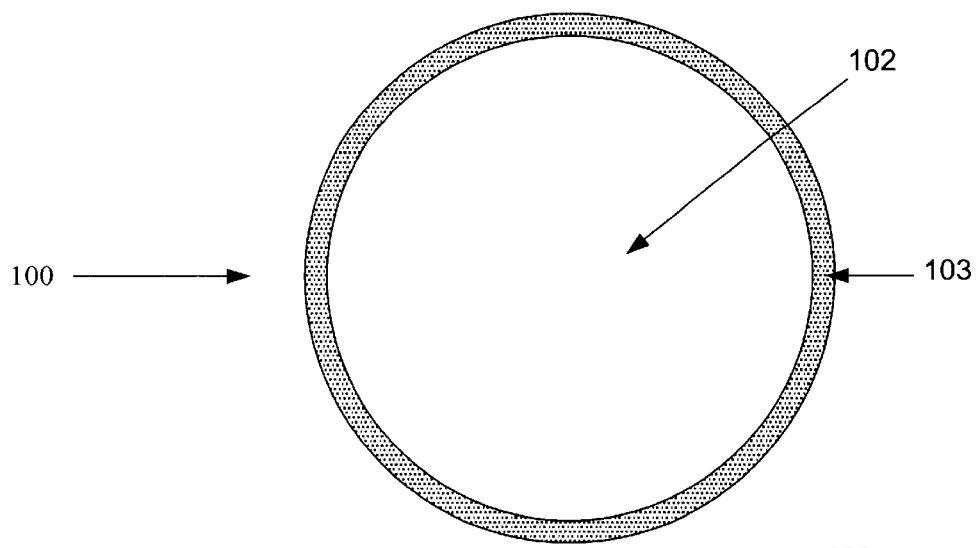
FIG. 1A is an illustration of a semiconductor wafer showing the location of the edge bevel region that is etched in accordance with this invention.
Figure 1A:
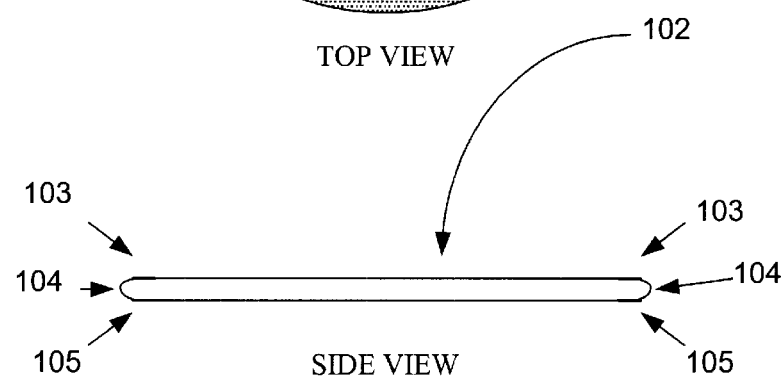
Figure 1A:
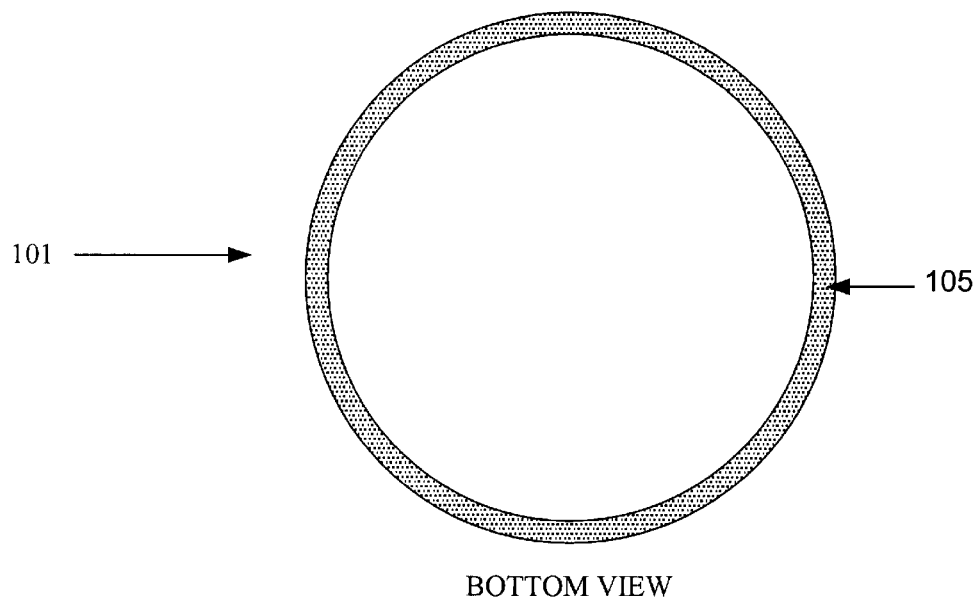

To facilitate understanding the concepts of this invention, a schematic illustration of a semiconductor wafer is shown in FIG. 1A. As shown, such semiconductor wafer has a top or "front" side 100 and a "backside" 101. The wafer also has an interior "active circuit region" 102 where integrated circuit devices with associated conductive metal routes are formed. To make maximum use of expensive semiconductor material, this active circuit region should constitute a high fraction of the area on the front side 100 of the wafer. With a 200 mm wafer, the present invention allows the interior active surface region to extend the useable active region to within at least 1.5 and 4 mm of the outer boundary of the wafer. As shown, integrated circuit wafers also include a "front edge" area 103, which is the region on the front of the wafer that lies outside the active circuit region, a "side edge" area 104 (sometimes referred to herein as an "edge bevel region") and a "back edge" area 105. The side edge lies in the area between the front side and the backside, and the back edge is roughly the area near the outer boundary of the wafer on its backside, approximately analogous to the front edge area. Unwanted metal such as copper may deposit on regions 103, 104, and 105. Some metal may also deposit over the entire backside 101. One use of the present invention is to remove unwanted metal from these regions without substantially affecting metal deposited on active region 102.

A "post-electrofill module" (PEM) or "EBR module" as referred to in this invention is a module that is specifically designed to carry out the edge bevel removal (EBR) process, as well as a backside etch (BSE) process, in most cases. It may also perform processes ancillary to the EBR, including pre-rinsing, rinsing, acid washing and drying. An integrated-electrofill module as referred to in this invention is a module that carries out electrofill.

Figure 1B:
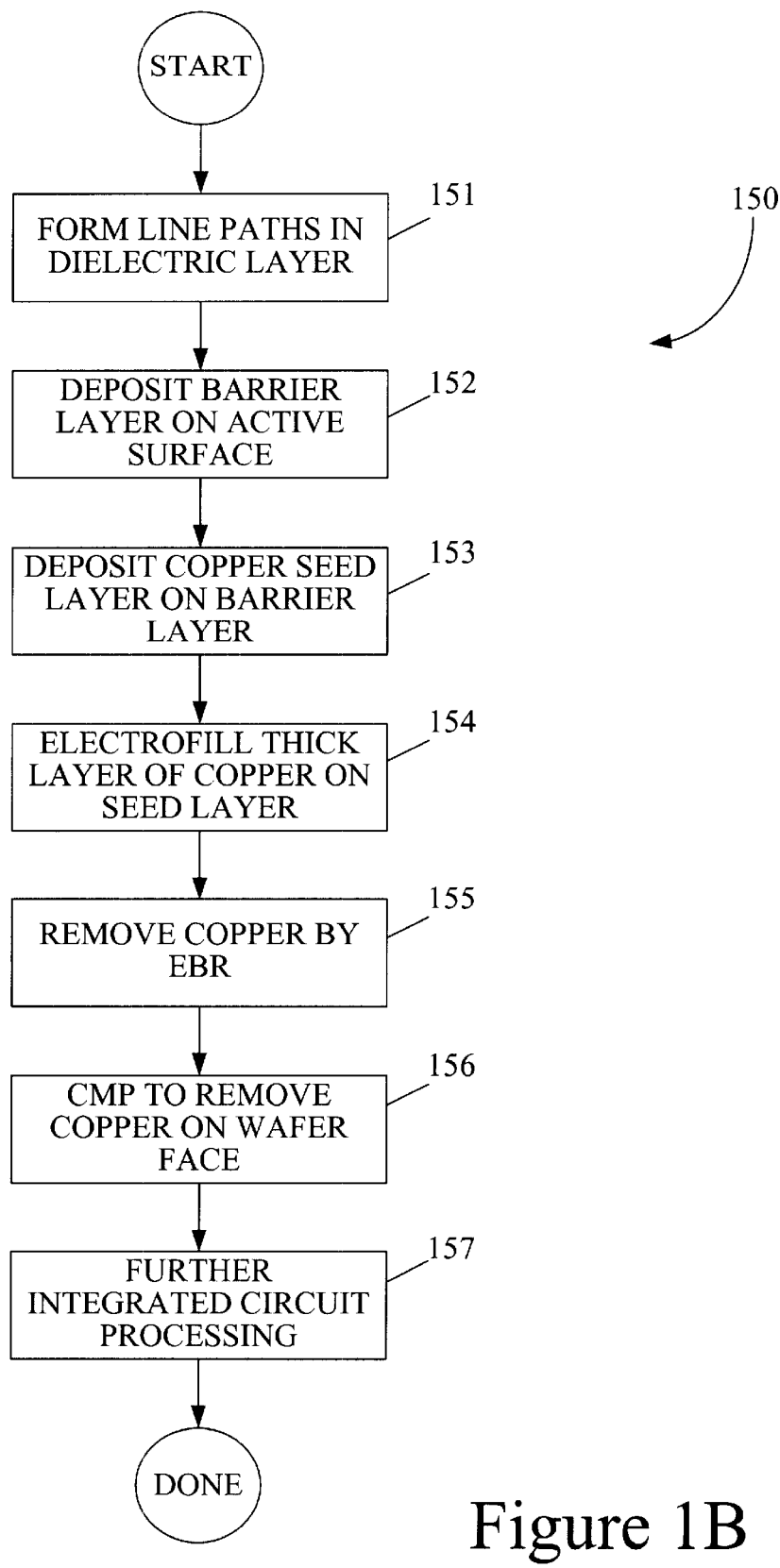
FIG. 1B is a process flow diagram illustrating relevant operations employed to form conductive copper lines a Damascene process in the context of this invention.

While details of the preferred embodiment may be found below in this application, a short description of a typical Damascene process will now be provided to facilitate understanding the context of the present invention. A typical Damascene process flow 150 is illustrated in the flowchart of FIG. 1B. Process 150 begins with formation of line paths 151 in a previously formed dielectric layer. These line paths may be etched as trenches and vias in a blanket layer of dielectric such as silicon dioxide. They define conductive routes between various devices on a semiconductor wafer. Because copper or other mobile conductive material provides the conductive paths of the semiconductor wafer, the underlying silicon devices must be protected from metal ions (e.g., copper) that might otherwise diffuse into the silicon. To accomplish this, the process includes depositing a thin diffusion barrier layer 152 before depositing the metal. Suitable materials for the diffusion barrier layer include tantalum, tantalum nitride, tungsten, titanium, and titanium tungsten. In a typical embodiment, the barrier layer is formed by a PVD process such as sputtering.

The wafer is now nearly ready to have its line paths inlayed with the electrofill copper. However, before electrofilling, a conductive surface coating must be applied. In the depicted process, this is accomplished by depositing a copper seed layer on the barrier layer at 153. A PVD process such as sputtering may be employed to this end. The wafer is then electrofilled at 154 with a thicker layer of copper over the seed layer, by electroplating using an electroplating solution. The copper is deposited to a thickness that completely fills the various line paths in the dielectric layer.

As mentioned, it is desirable to use as much of the wafer surface for active circuitry as possible. While it is generally a straightforward matter to shield unwanted areas from an electroplating solution, the same kind of shielding cannot be so easily and precisely done with PVD. Thus deposition of PVD copper in some unwanted areas cannot be avoided. This copper must be removed, and this is accomplished by the edge bevel removal (EBR) and/or backside etch BSE processes of the present invention.

With EBR at 155, a copper etchant is applied to the front edge of the wafer in a thin stream. The etchant is preferably applied under viscous flow conditions so that it remains in a thin, viscous layer near the point on the wafer where it is applied, and thus avoids splashing the interior of the wafer. Because the etchant is also generally applied with a radial velocity component, and because of the centripetal acceleration effects of the rotating wafer, the thin viscous layer flows outward, down over the side edge and a few millimeters onto the backside, thus accomplishing removal of the PVD copper from all three of these areas. More specifics of the EBR process are described below. After EBR, the electroplated copper is planarized, generally by chemical-mechanical polishing (CMP) down to the dielectric at 156 in preparation for further processing (illustrated at 157), generally the addition of subsequent dielectric and metalization layers.

Figure 1C:
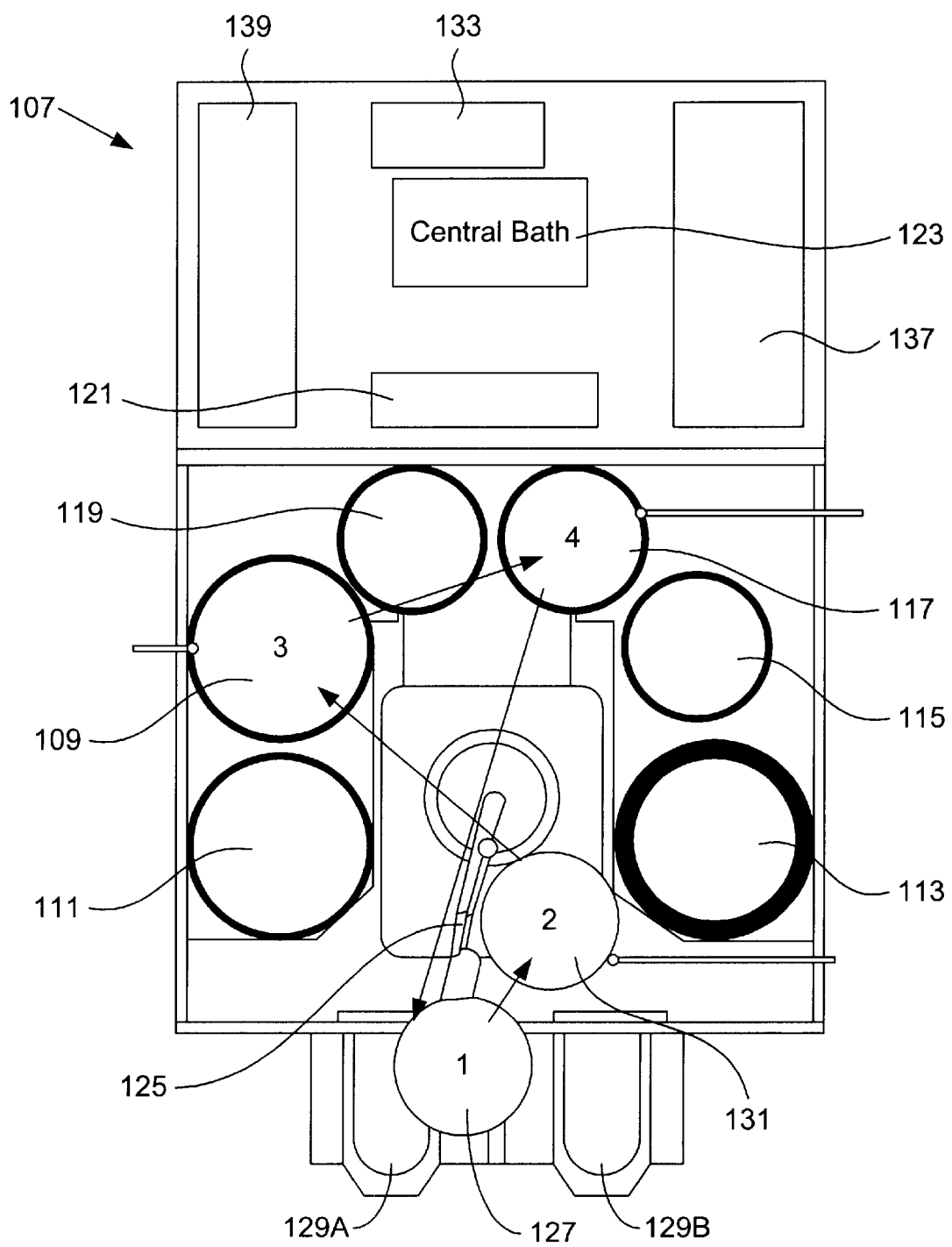
FIG. 1C is a block diagram illustrating a group of modules used to form copper conductive lines on an integrated circuit.

FIG. 1C depicts an electrofill system 107 in which the invention may reside. The specific system includes three separate electrofill modules 109, 111 and 113. System 107 also includes three separate post electrofill modules 115, 117 and 119. Each of these may be employed to perform each of the following functions: edge bevel removal, backside etching, and acid cleaning of wafers after they have been electrofilled by one of modules 109, 111, and 113. System 107 also includes a chemical dilution module 121 and a central electrofill bath 123. This is a tank that holds the chemical solution used as the electroplating bath in the electrofill modules. System 107 also includes a dosing system 133 that stores and delivers chemical additives for the plating bath. A chemical dilution module 135 stores and mixes chemicals to be used as the etchant in the post electrofill modules. A filtration and pumping unit 137 filters the plating solution for central bath 123 and pumps it to the electrofill modules. Finally, an electronics unit 139 provides the electronic and interface controls required to operate system 107. Unit 139 may also provide a power supply for the system.

In operation, a robot including a robot arm 125 selects wafers such as a wafer 127 from a wafer cassette such as a cassette 129A or a cassette 129B. Robot arm 125 may attach to wafer 127 using a vacuum attachment.

To ensure that wafer 127 is properly aligned on robot arm 125 for precision delivery to an electrofill module, robot arm 125 transports wafer 127 to an aligner 131. In a preferred embodiment, aligner 131 includes alignment arms against which robot arm 125 pushes wafer 127. When wafer 127 is properly aligned against the alignment arms, the robot arm 125 moves to a preset position with respect to the alignment arms. It then reattaches to wafer 127 and delivers it to one of the electrofill modules such as electrofill module 109. There, wafer 127 is electrofilled with copper metal. Electrofill module 109 employs electrolyte from a central bath 123.

After the electrofill operation completes, robot arm 125 removes wafer 127 from electrofill module 109 and transports it to one of the post-electrofill modules such as module 117. There unwanted copper from certain locations on the wafer (namely the edge bevel region and the backside) is etched away by an etchant solution provided by chemical dilution module 121.

Preferably wafer 127 is precisely aligned within post electrofill module 117 without making use of aligner 131. To this end, the post electrofill modules may be provided with an alignment chuck as referenced elsewhere herein. In alternative embodiment, wafer 127 is separately aligned within aligner 131 after electrofill and prior to edge bevel removal in module 117.

After processing in post electrofill module 117 is complete, robot arm 125 retrieves wafer 127 from the module and returns it to cassette 129A. From there the cassettes can be provided to other systems such as a chemical mechanical polishing system for further processing.

Figure 2A:
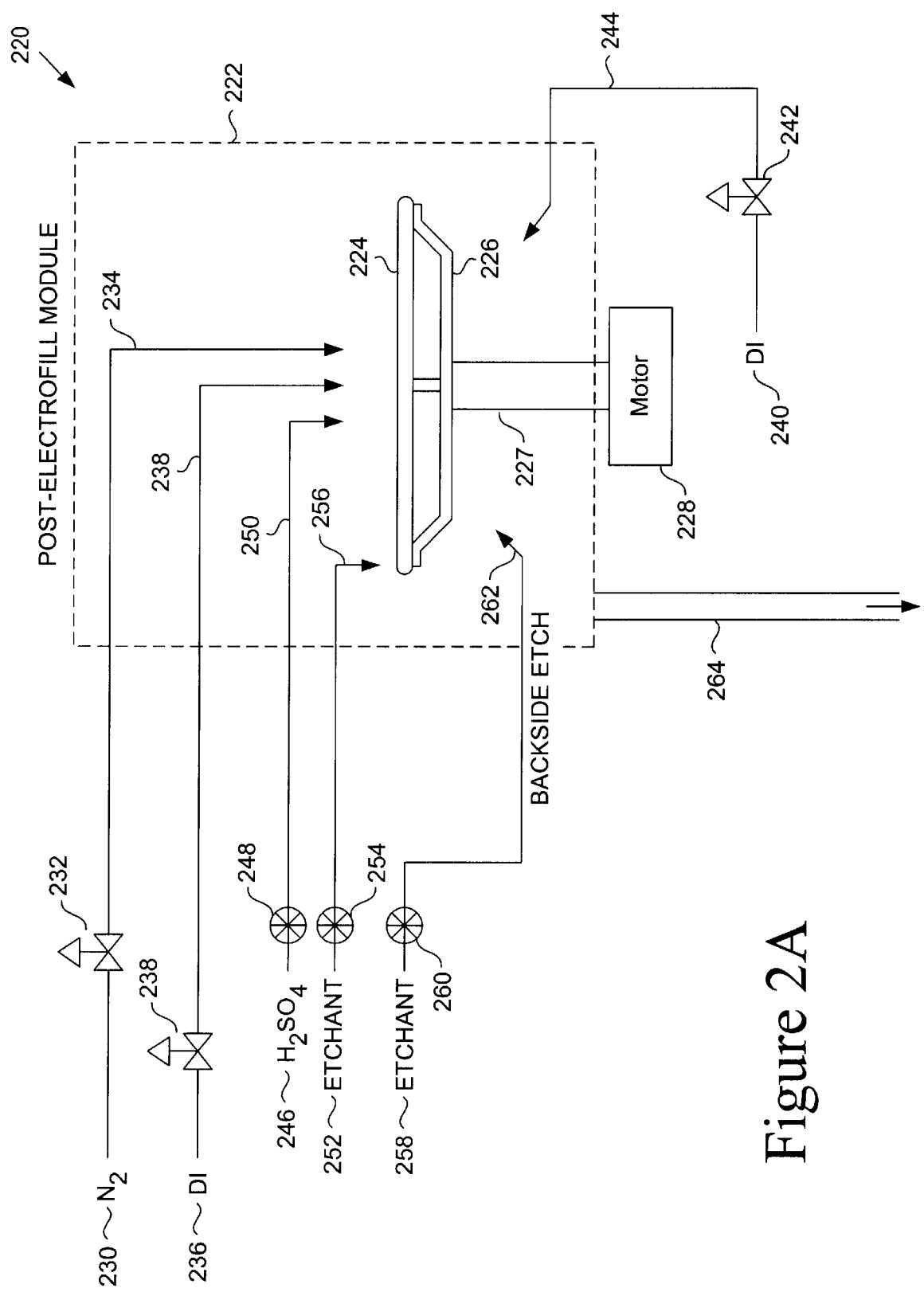
FIG. 2A is a block diagram illustrating various elements of a post-electrofill module in accordance with one embodiment of this invention.
Figure 2B:
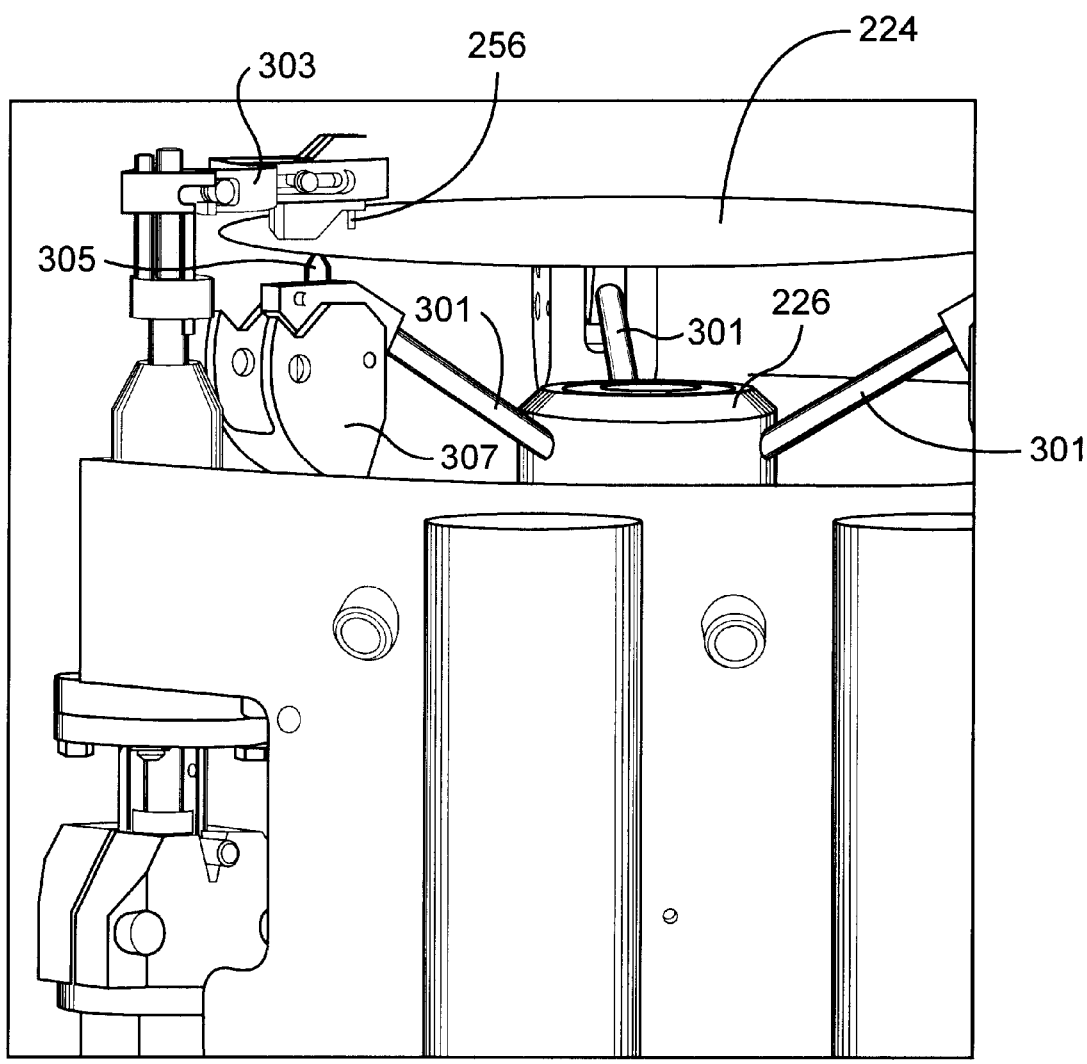
FIG. 2B is a perspective view of a post-electrofill module.

FIG. 2A schematically illustrates one preferred post-electrofill module 220 suitable for use with this invention. FIG. 2B presents such module in a perspective view. As shown, module 220 includes a chamber 222 in which a semiconductor wafer 224 rotates. Wafer 224 resides on a wafer chuck 226 which imparts rotational motion to wafer 224. Chamber 222 is outfitted with a drain and associated drain line 264. The drain allows the various liquid streams provided to chamber 222 to be removed for waste treatment.

A motor 228 controls the rotation of chuck 226. Motor 228 should be easy to control and should smoothly transition between various rotational speeds. It may reside within or without chamber 222. In some embodiments, to protect against damage from liquid etchant, motor 228 resides outside of chamber 222 and is separated therefrom by a seal through which a rotating shaft 227 passes. Any wobble in the shaft on rotation should be small (~<0.05 millimeters for example) so that the location of fluid nozzles with respect to the wafer does not vary substantially, nor shake the wafer from its center while it is not confined by alignment or clamping members. Preferably, motor 228 can rapidly accelerate and decelerate (in a controlled fashion) chuck 226 and wafer 225 at rotation rates between 0 and about 2000 rpm. The motor speed and other operations should be controllable by a computer.

Chuck 226 may be of any suitable design that holds wafer 224 in position during various rotational speeds. It may also facilitate alignment of wafer 224 for the etching process. A few particularly preferred examples of wafer chucks are described in U.S. patent application Ser. No. 09/558,249 previously incorporated by reference.

Chamber 222 may be of any suitable design that confines the liquid etchant within its interior and allows delivery of the various fluids to wafer 224. It should be constructed of an etchant resistant material and include ports and nozzles for the various liquid and gaseous streams used during etching and cleaning.

Gaseous nitrogen is provided to post electrofill module 220 from a source of nitrogen 230. Preferably, this is a central source of nitrogen available to various processes throughout an integrated circuit manufacturing facility. Nitrogen from source 230 is delivered to chamber 222 under the control of a valve 232. The gaseous nitrogen is delivered into chamber 222 via a line and nozzle 234 positioned to deliver the nitrogen directly onto wafer 224, preferably at the center of the wafer. This enables blowing dry, particle-free nitrogen at the center, upper face of the wafer. This orientation of the nozzle increases the drying rate at the wafer center, where the centrifugal forces are small. Other suitable gas drying sub-systems may be employed as will be appreciated by those of skill in the art. For example, drying gases other than nitrogen may be employed in some embodiments. Also, the orientation and blowing direction of the nitrogen nozzle may be widely varied.

The next input of interest to module 220 is a source of deionized water 236. As with the source of nitrogen 230, the source of deionized water 236 preferably originates with a central source within an integrated circuit fabrication facility. The deionized water is delivered to chamber 222 under the control of a valve 238 and through a delivery line and nozzle 238. Note that line 238 directs deionized water onto the top of wafer 224. This enables rinsing of the wafer's top side. A preferred nozzle with an internal diameter of between ⅛" and ¼" diameter delivers a stream of fluid directed at the center of a wafer. The nozzle height above the wafer surface being between 1 to 2 inches. Alternatively a nozzle sprays fluid as a thin "fan" that spreads out over the inner three-quarters of the wafer diameter. Preferably, the thickness of the fan is no more than about one-fifth of the wafer diameter. The spray can impact the wafer with a velocity in the same direction as the wafer is rotating, or opposite the direction of rotation, or even in both directions if the spray fan crosses the wafer center. Preferably, the spray is directed opposite to the direction of rotation to increase convective mixing.

A similar deionized water system provides a stream or fan of deionized water to the backside of wafer 224. This deionized water is provided from a source of deionized water 240, which may be the same as source 236. A valve 242 controls the flow of deionized water onto the backside of wafer 224 via a line and nozzle 244. The nozzle associated with 244 may have the same design criteria as just mentioned for nozzle 238. The goal is to rinse etchant from the backside of wafer 224.

In a preferred embodiment, an acid rinse is conducted on the front side of wafer 224. To this end, a source of sulfuric acid 246 provides sulfuric acid to a delivery line and nozzle 250. Other acids may be used as appropriate. Preferably, the source 246 of sulfuric acid is a chemical dilution module described in U.S. patent application Ser. No. 09/557,695. Preferably, this module includes a valve that controls the delivery of sulfuric acid to module 220. The flow of sulfuric acid into chamber 222 may be monitored by a mass flow meter 248. Note that in the depicted embodiment nozzle 250 is oriented to direct sulfuric acid onto the center of the front side of wafer 224. After the acid is delivered to the center of the wafer it then spins out into the edge of the wafer during rotation. This solution is applied to remove residual copper oxide which remains after oxidizing (etching) the wafer and aids in the overall cleaning of the wafer. Only a relatively small amount of acid is typically required (e.g., 0.5 to 2 milliliters/200 mm wafer). After its application, the wafer's front side is rinsed with deionized water through nozzle 238.

Liquid etchant used to remove copper or other unwanted metal from portions of wafer 224 is provided from a source of liquid etchant 252 as shown. Preferably, this source is provided by the above-mentioned chemical dilution module. The etchant passes through a mass flow meter 254 and is delivered to wafer 224 via a line and nozzle 256. Preferably, the etchant is delivered to the edge bevel region of wafer 224 to remove PVD copper in that region.

A second liquid etchant stream may be delivered to the backside of wafer 224 in order to etch off any copper or other unwanted metal that may have been deposited on the backside of wafer 224. As shown, such etchant is delivered from an etchant source 258. Preferably, this is the same source as 252. In other words, the chemical dilution module provides etchant for both edge bevel removal and backside etch. As shown, etchant from source 258 passes through a mass flow meter 260 and through a nozzle 262, which directs it onto the backside of wafer 224.

Figure 2C:
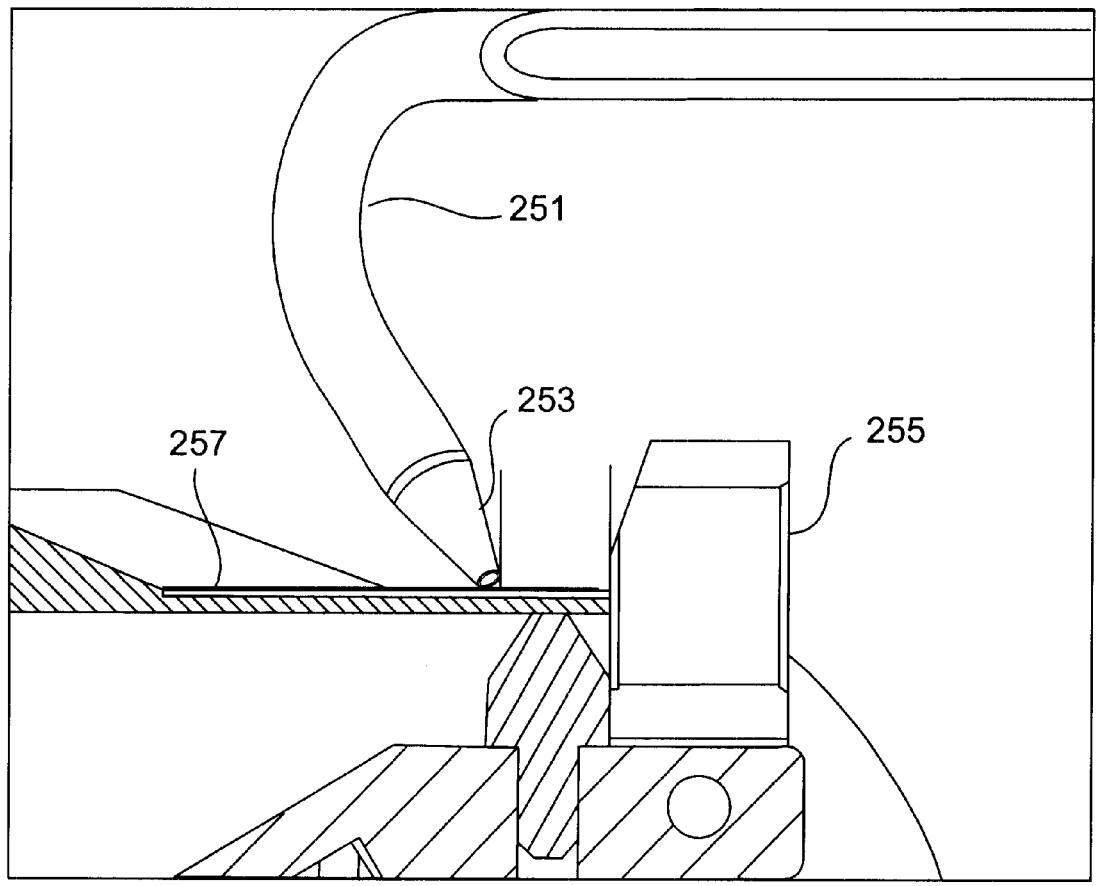
FIG. 2C is a side-view showing a nozzle and nozzle tip sitting on top of the wafer plane.
Figure 2D:
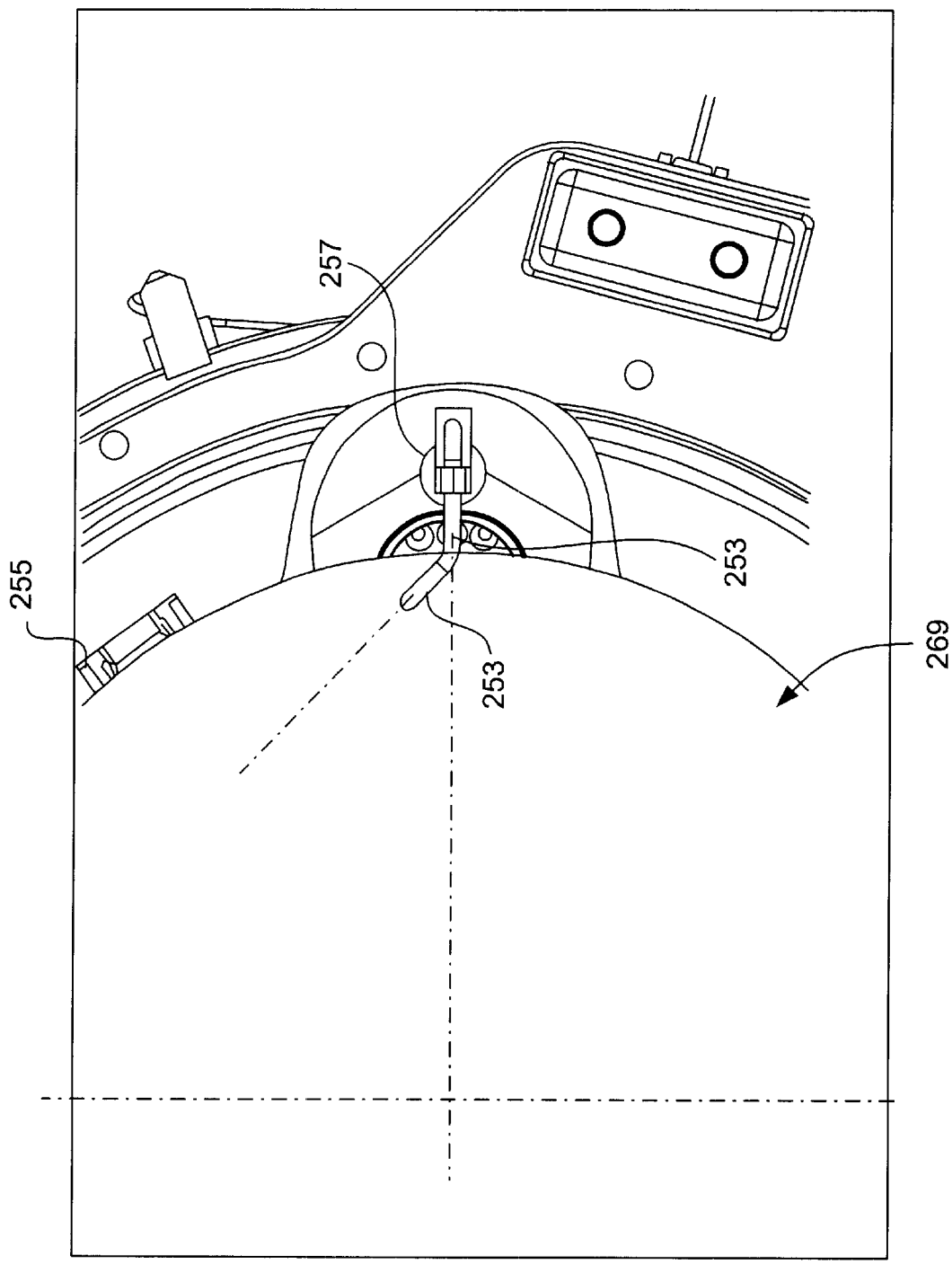
FIG. 2D is a top-view showing a nozzle and nozzle tip sitting on top of the wafer plane.

FIG. 2C is a side-view diagram showing some components of the apparatus used to deliver etchant during EBR, in accordance with one embodiment of this invention. A nozzle 251 delivers the etchant. It includes a nozzle tip 253 that can.be manufactured as part of the same unitary part as the nozzle 251, but it is preferred that the nozzle tip 253 be a separate, replaceable piece, as will be discussed below. Also shown in this diagram are one of the chuck alignment pins 255 and the teach waferplane 257 where the nozzle tip contacts during set-up and calibration. FIG. 2D is a top-view showing the same apparatus, including the nozzle 251, nozzle tip 253, wafer support clamp 255 and the wafer 269.

Figure 2E:
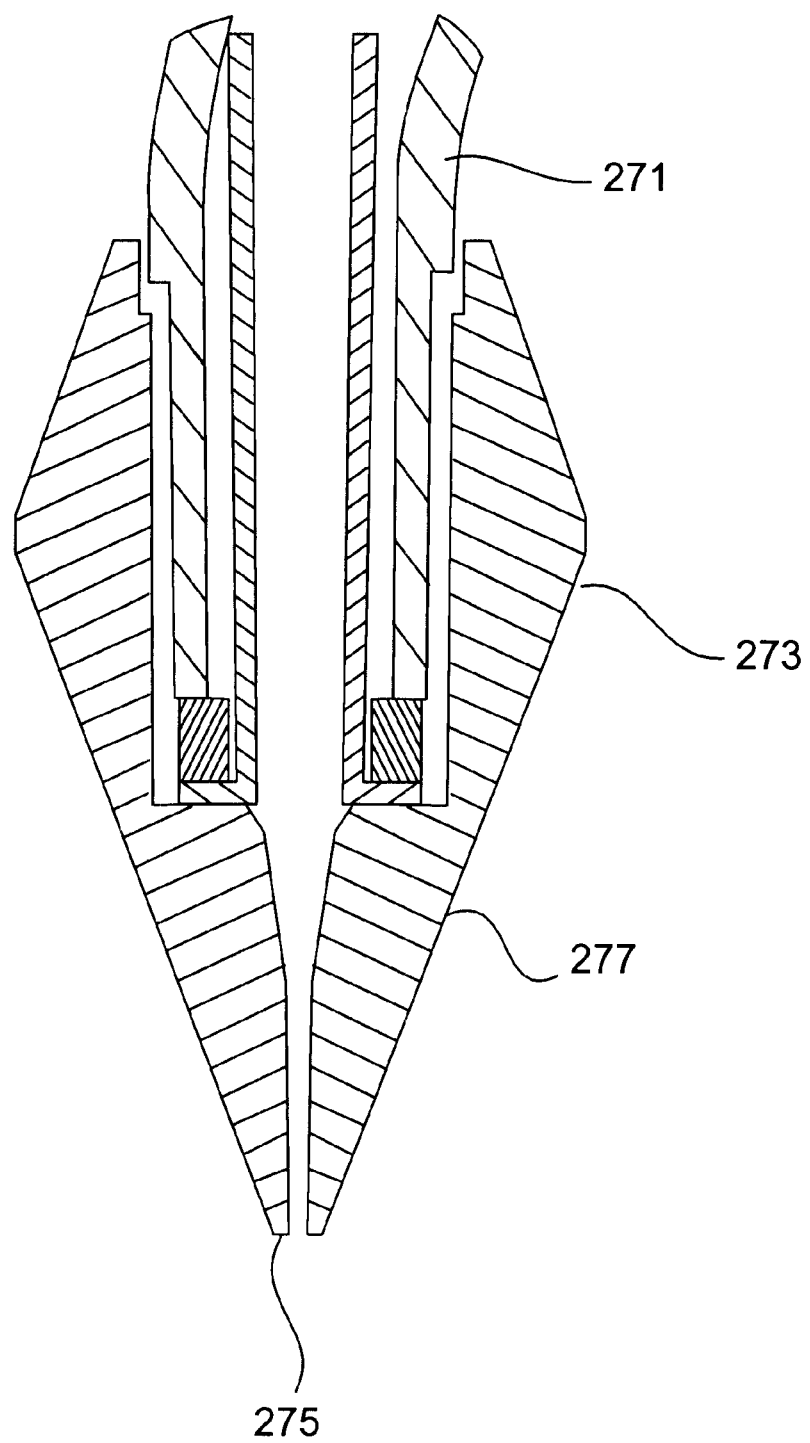
FIG. 2E is a close-up of a nozzle and nozzle tip, the nozzle tip being replaceable and precision drilled for the desired orifice size.

FIG. 2E is a detailed view of a nozzle 271, including a separate nozzle tip 273. It has been found that a nozzle orifice size of 0.016 to 0.017 inches works well with the preferred embodiments of this invention. However, it can be difficult to precisely and consistently manufacture the orifice to this size, and orifices of between 0.020 and 0.014 inches are typically produced in practice. Such variations can change the exit velocity by a factor of up to 2. Because the quality of the wafer surface (the presence or absence of streaking, spotting, etc.) is strong function of exit velocity, the nozzle orifice should be consistently sized to a precise diameter in each and every apparatus produced. This has not been possible with the existing design which relied on a tapered Teflon tube inserted into a soft PVDF nozzle tip to control the dispense stream size. Control of the tubing size and wear associated with the softer PVDF tip material limits the life and degrades the performance of the nozzle. It is therefore desirable to make a separate nozzle tip 273 that can be precision drilled and threaded onto the external surface of the nozzle piece 271. Preferably, a relatively hard, etchant-resistant, material such as PPS (polyphyenylene sulfide) or various chemically compatible ceramic materials (e.g. alumina or zeolite) is employed. FIG. 2E also shows the orifice 275 in the nozzle tip, as well as the inner flanged tube end 277 of the nozzle 271, that allow a tight seal between the nozzle 271 and nozzle tip 273.

Figure 3A:
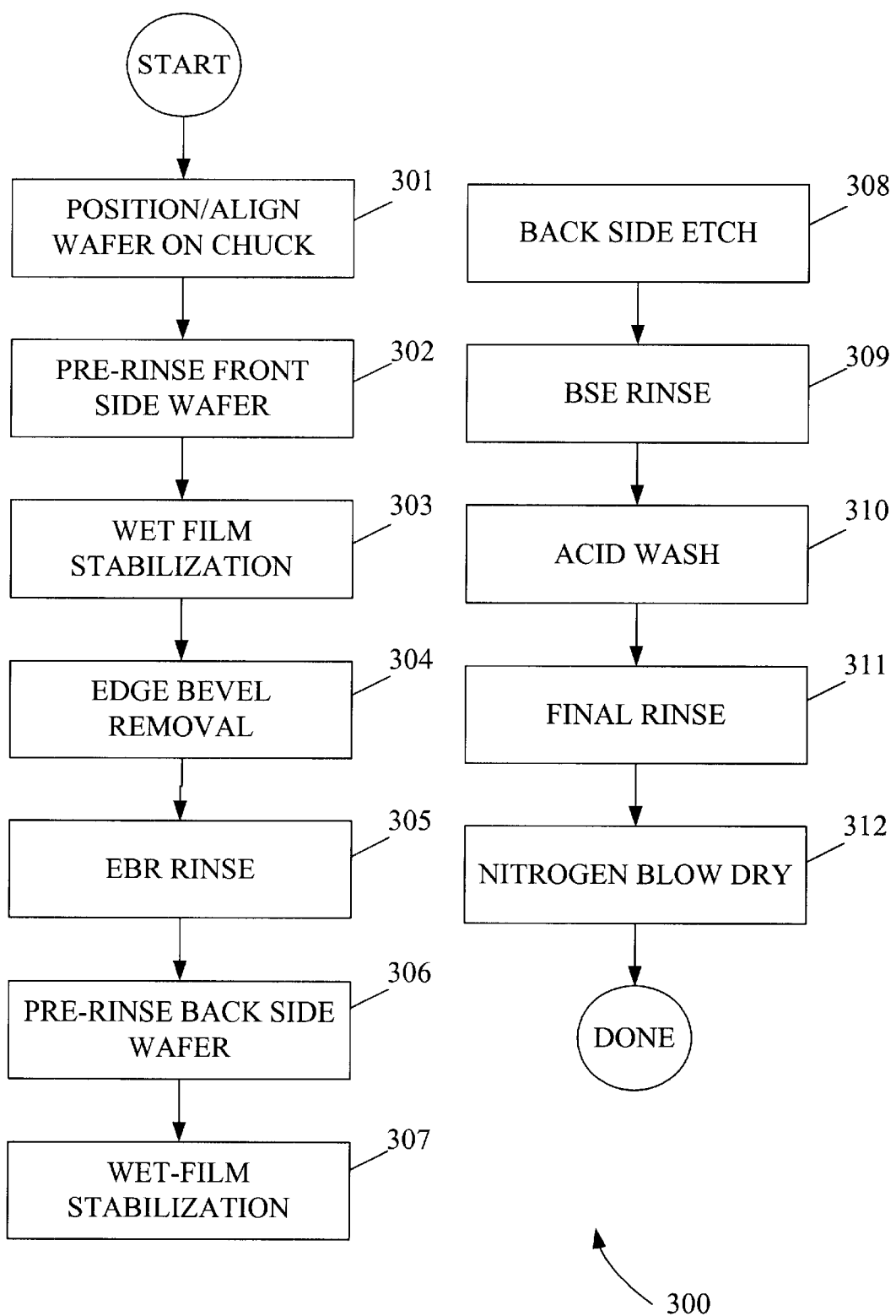
FIG. 3A is a process flow diagram illustrating a typical sequence of operations employed with a post-electrofill module in accordance with an embodiment of this invention.

A specific embodiment of the EBR process is illustrated in FIG. 3A. A second, preferred, embodiment will be described below. The depicted EBR process 300 can be carried out by a post-electrofill module, such as module 220 of FIG. 2A, that is specifically designed to carry out the EBR process. The process begins at 301, with a robot arm placing the wafer on the module chuck for EBR processing. The wafer is placed into the chuck onto a set of support pins. The wafer is aligned inside the chuck by the vertical alignment pins. The support pins hold the wafer in place by static friction when the wafer is rotated. A vacuum chuck can also be used. After the robot arm retracts, deionized water is applied to the front of the wafer and the wafer is spun at about 150–400 rpm in order to pre-rinse the wafer of any particles and contaminants left over from previous processing steps. See 302. In the simplest embodiment, the pre-rinse operation employs only deionized water—no acid. The pre-rinse operation takes place 10 to 30 seconds with a flow rate of 200–800 ml/minute depending on rinse water temperature, plating chemistry, deionized water flow rate and the rotational speed of the wafer. It is sometime desireable to use hot rinse water to accelerate the pre-rinse efficency. Therefore, DI water at from 20 to 50 C can be employeed depending on the economics of the operations.

The deionized water is then turned off and the wafer continues to spin at a speed of of between about 150–350 rpm , which creates a uniformly thin layer of deionized water (wet-film stabilization). See 303. This wet-film stabilization facilitates an even distribution of the etchant over the front side of the wafer. At this time the wafer is in contact with the support pins only, the alignment pins have rotated away from the edge of the wafer and the clamps are at mid-position.

After wet-film stabilization 303, a core feature of the EBR, actual removal of the edge bevel metal 304 is performed Typically, the wafer continues to be rotated but 0.5 to 3 seconds is allowed to elapse before EBR, in order to allow the deionized water to thin out. Operation 304 is typically carried out at about 150–400 rpm, more preferably—200 to 250 rpm for 200 mm wafer and 175 to 225 rpm for 300 mm wafers . This rate of rotation helps ensure that the entire edge exclusion area is covered by the EBR etchant. It is preferred to maintain the same pre-rinse and EBR speed to prevent the wafer from slipping off the support pins and de-centering during any acceleration/deceleration. During these operations the wafer is not held at a centering position. The rate of change in rotational velocity prior to the EBR step results in movement of the wafer on the support pins. Pins with greater friction coefficent are preferred as long as they do not flake or generate particles. Therefore, this parameter should also be controlled. It is preferred that the rate exceed about 150 rpm/sec when using typical plastic support pins (e.g. PPS or PVDF).

The EBR etchant is typically applied to the surface of the wafer using a thin nozzle tube, which has a nozzle opening at or near its end. When dispensing a small amount of fluid onto a surface as such, three flow regimes can generally result. The first regime is edge beading, where surface tension forces dominate the behavior of the fluid, the second is viscous flow, where viscous forces predominate, and the third is inertial, where inertial forces predominate and the fluid tends to spray. As explained below, the preferred flow regime is the viscous flow. In a specific example, an EBR dispense arm is positioned over the wafer edge as described below with reference to FIG. 4B.

In one embodiment, EBR is performed under the following conditions: a total of about 2 to 14 milliliters etchant is delivered at a rate of about 0.25 to 2 milliliters/second (more preferably about 0.3 to 0.5 milliliters/second) for a 200 millimeter wafer. The amount delievered depends on the film thickness to be removed, the concentration of chemical etchant, rotation rate and etchant temperature.

In a second, preferred, embodiment, the etchant is delivered in stages: a high flow rate stage followed by a lower flow rate stage. Alternatively, all the etchant may be delivered in the lower flow rate stage. In other words, the high flow rate stage is not performed. This embodiment is advantageously performed with a nozzle orifice diameter of about 0.016 to 0.017 inches.

Assuming that the high flow rate stage is performed, it involves delivering etchant to the wafer at a flow rate of about 0.5 to 1.5 cc/seconds for a duration of at most about 1 second. This stage helps break up surface tension resistance to wetting, forcing wetting at the edge of the wafer.

In the lower flow rate stage of the second embodiment (which may be the only stage), the etchant is delivered at a rate of about 0.15 to 0.35 cc/second (preferably about 0.3 cc/second) for about 20 to 60 seconds. In a specific embodiment (optimized for 1 micrometer thick films), about 8 cc of etchant is delivered over a period of approximately 25 seconds (which may vary depending upon flow rate). In another specific embodiment (optimized for 2 micrometer thick films), about 14 cc of etchant is applied over a period of about 45 seconds (which may vary depending upon flow rate).

During EBR, some etchant may flow onto the backside of the wafer and etch it. An alternative embodiment for practicing the present invention is to have the wafer facing upside down, and to apply the etchant to the backside edge.

After the required amount of liquid etchant has been applied to the edge of the wafer, deionized water is again applied to the front side of the wafer as a post-EBR rinse 305. This application of deionized water will generally continue through the subsequent operations of backside etching and backside rinsing so as to protect the wafer from any extraneous backside etchant spray and damage. While the deionized water is applied, the dispense arm moves the etchant nozzle away from the wafer.

At generally about the same time as commencement of step 305, the backside of the wafer is pre-rinsed 206 with deionized water, which is wet-film stabilized 307 in much the same manner that the front side of the wafer was (e.g., the wafer rotation speed is held at about 350 to 500 rpm). After the flow of deionized water to the wafer backside ends, a backside etch operation 308 is performed—generally with the same etchant that was used for the EBR. In a specific embodiment, a thin jet (initially 0.02 to 0.04 inches in diameter) of liquid etchant is aimed at the center of the wafer backside. The etchant is preferably delivered from a tubular nozzle having a diameter of about 0.02 to 0.04 inches and a length of at least about 5 times the diameter. This etchant then disperses over the entire backside of the wafer. The purpose of the BSE is to remove any residual copper that was formed on the backside of the wafer during formation of the seed layer of PVD copper.The BSE etchant is typically applied using a spray nozzle. Despite gravity, surface tension generally keeps the etchant in contact with the bottom of the wafer long enough to carry out BSE. Since the chuck arms could interfere with the spraying of etchant on the backside of the wafer, the angle of the spray nozzle may be varied during BSE to ensure thorough application of the etchant. Because the wafer is generally held up by support pins that impinge on the backside of the wafer, the process is generally carried out at two different speeds to ensure that the etchant flows adequately over the entire surface. For instance, the wafer may be rotated at about 350 rpm during part of the BSE and then rotated at 500–700 rpm for the remainder of the BSE. The portions of the backside blocked by the arms will differ at the two speeds, thus ensuring complete coverage. Overall, the BSE process typically takes 1–4 seconds and uses 1 to 5 cubic centimeters of the preferred etchant described below to reduce the concentration of copper on the backside to less than $5 \times 10^{-10}$ atoms per $cm^2$ of substrate.

After BSE, both sides of the wafer (or at least the backside of the wafer) are rinsed with deionized water to rinse any liquid etchant, particles and contaminants remaining from the BSE. See 309. Then the flow of deionized water to the front side ends and about 2 to 4 milliliters of a dilute acid, generally less than about 15% by weight acid, is applied to the front side of the wafer to remove residual metal oxide and remove the associated discoloration. See 311. In a specific embodiment, the acid is applied at a rate of about 2 cc/sec. After the acid rinse, deionized water is once again applied to both sides of the wafer, or at least the front side, to rinse the acid from the wafer. In a specific embodiment, the deionized water is applied for about 15–30 seconds at about 300–400 milliliters/min. Finally the wafer can be spun and blow-dried, as desired, on both sides with nitrogen. See 312. Generally, any drying step is carried out at about 750–2000 rpm for about 10 to 60 seconds, and necessitates a clamping for the wafer once it reaches about 750 rpm. Many embodiments for the clamping mechanism are possible, and some of these are discussed in more detail below. After this processing in the PEM is completed, a robot arm picks up the wafer and puts it in a cassette.

A second, especially preferred, embodiment of the EBR process is now described with reference to FIGS. 3A and 3B. This embodiment is particularly effective at eliminating streaking and narrowing the taper of thex wafer. As with the previously described embodiment, this process can be carried out by a post-electrofill module, such as module 220 of FIG. 2A. The entire process is conducted at a rotation speed of between about 150–400 rpm. In one specific embodiment, the rotational speed is about 225 rpm and in another specific embodiment, the rotational speed is about 350 rpm. So initially, the wafer is accelerated up to a processing speed of 225 rpm, or whatever speed is chosen for the process at hand. In the context of FIG. 3A, this may be viewed as part of operation 301.

As indicated above, the wafer is pre-rinsed with deionized water applied to the front of the wafer, while the wafer is spun at about 150–400 rpm. See 302. For this second embodiment, the pre-rinse operation is performed in multiple sub-operations. FIG. 3B depicts these sub-operations, which correspond to operations 302 and 303 of FIG. 3A.

The pre-wet conditions are driven by two goals: (1) providing a taper width of 400 micrometers or in that neighborhood and (2) performing prewetting rapidly so as to maintain a high throughput. Ideally, the full prewetting operation will take no longer than about 6 seconds (more preferably not longer than about 4.5 seconds).

The prewet must be sufficiently long so that the edge bevel etch can proceed rapidly and produce the desired 200–400 micrometer taper width. It is believed (although not proven) that the pre-wet operation helps removes residual electroplating additives (e.g. accelerators and/or suppressors) that protect the copper from rapid attack by the edge bevel etchant.

The taper is generically defined as the transition from a region with full metalization (e.g., the inner or active area of the wafer including all the dies) to a region without metal (e.g., the edge exclusion area). The taper is typically measured from a region of 95% metal thickness to 0% metal thickness. With the EBR method as described, the wafer typically starts with a taper of about 700 micrometers or more.

Figure 3B:
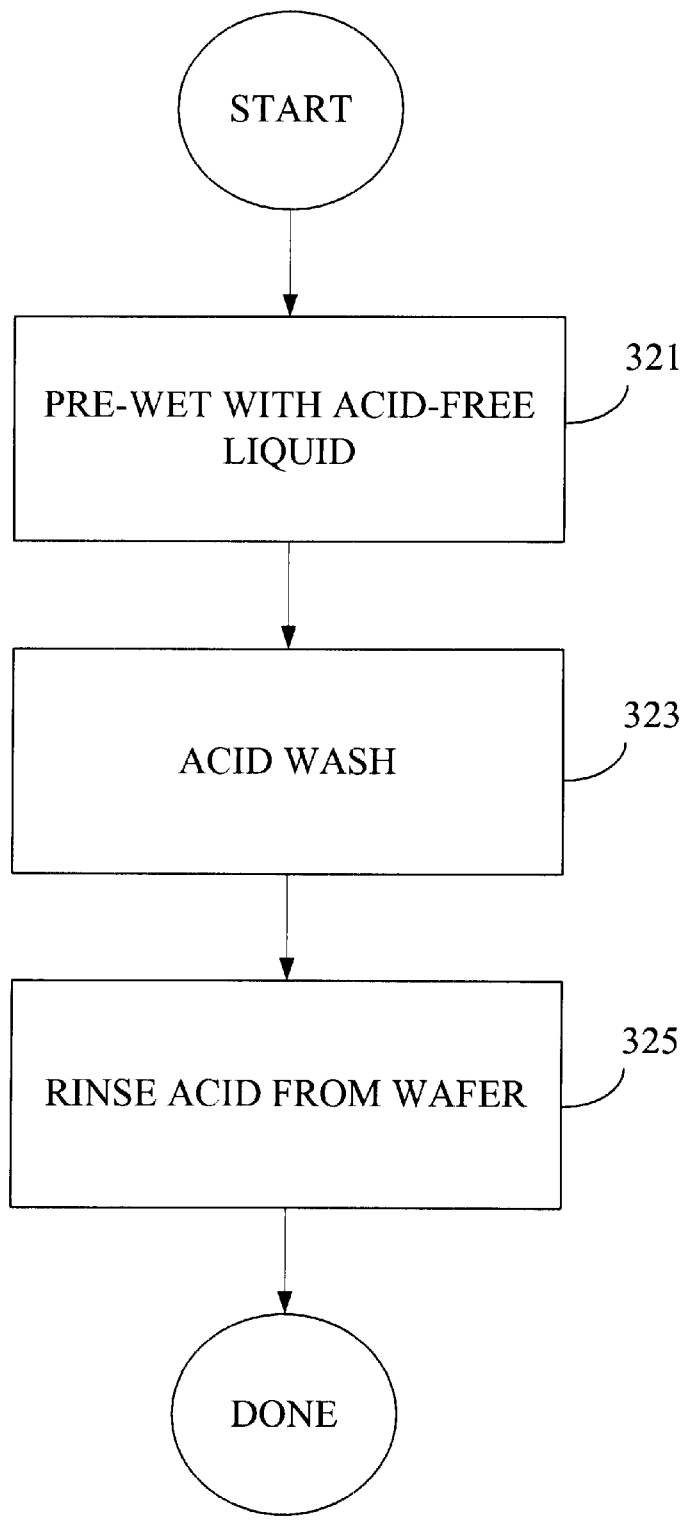
FIG. 3B is a process flow diagram depicting a pre-rinse operation in accordance with an especially preferred embodiment of this invention.

In a preferred embodiment depicted in FIG. 3B, used with conventional plating chemistries, the pre-wet operation includes three suboperations. Initially, at 321, the system delivers about 400–1000 ml/minute deionized water for about 2–4 seconds (preferably about 600 ml/minute for about 2 seconds). Note that this rate may be doubled or increased by other multiple if two of more deionized water nozzles are employed. Thus, one embodiment of this invention employs two or more nozzles.

Second, at 323, the system delivers about 0.5 to 2 ml (preferably about 1 ml) of about 4–6% sulfuric acid for about 0.1 to 2 seconds (at about 1–4 ml/second—preferably for about 0.5 seconds) and concurrently deliver deionized water at about 400–1000 ml/minute for about 0.1 to 2 seconds (preferably about 600 ml/minute for about 0.5 seconds). This suboperation may employ two separate nozzles/delivery lines. For example, referring to FIG. 2A, deionized water is delivered via line 238 and sulfuric acid is concurrently delivered through line 250. Note that the flow of deionized water may be continuous between suboperations 321 and 323—although this is not necessary.

Third, at 325, the system delivers about 400–1000 ml/minute deionized water for about 2–4 seconds (preferably about 600 ml/minute for about 2 seconds). Again, the flow of deionized water may be continuous—in this case between suboperations 323 and 325—although this is not necessary.

During all pre-wet suboperations, the wafer rotational speed is preferably maintained at about 150 to 400 rpm. (For 200 mm wafers, 225 or 350 rpm may be used.) In all embodiments, the length of the pre-wet operation depends on the plating chemistry and the rotational speed of the wafer. If the plating chemistry includes high concentrations of accelerators or suppressors, then relatively longer pre-wet times are required. If the rotational speed is relatively fast, then shorter pre-wet times are necessary.

The total pre-wet operation is typically carried out for about 4–24 seconds at room temperature, with a decrease of about a factor of 2 for every 10° C. increase in temperature. The parameters of the pre-wetting ensure that the entire front side of the wafer is rinsed, including the areas that were excluded from electrofill by the clamshell lip seal.

After these pre-wet operations, the process is conducted in the manner described above, beginning at block 304. This second embodiment of the invention will preferably reduce the taper of the wafer to about 200 micrometers. In addition to narrowing the taper, the embodiment can also be used to remove electrofilled copper, which commonly reaches thicknesses 1 or even 2 micrometers. The thin taper widths provided by this invention are particularly well-suited for processes including subsequent CMP. Further, the processing of this embodiment is particularly effective at preventing streaks, which are area of localized film oxidation on the wafer. Streaking is caused by the presence of dilute EBR etching fluid landing on unwanted areas of the wafer (typically after contact with the module wall), and is typically characterized by regions of oxidation of 50 Å or more in thickness. The streaks can be determined by visual inspection or defect analysis instrumentation such as an AIT defect analyzer (made by KLA/Tencor). The addition of a rinse deflector attached to the module wall can also be used to prevent deflection of the etchant back onto the wafer surface.

Turning again to FIGS. 2A and 2B, some features of the PEM will be described in further detail. First, note that wafer 224 rides on support pins 285 (located on wafer chuck arms 281) by static friction. Preferably, the support pins 285 are located from about 5 to 20 millimeters, more preferably about 5 to 10 millimeters, in from the edge of wafer 224. The design of the support pins is determined by the need to supply enough friction to 1) keep the wafer from flying off the chuck if it is aligned slightly off center (i.e. when aligned to the tolerance of the specification of the edge bevel removal process), 2) not slip as the wafer is accelerated (at typically a rate of 50 to 300 rpm/sec (100 rpm/sec in a specific embodiment)) from rest to the EBR rotation rate, and 3) not shed or generate particles. As the wafer's rotational speed increases, however, it reaches a velocity at which the static friction from resting on the pins can no longer constrain it due to small misalignments and the associated centripetal force. To prevent the wafer from flying off chuck 226 at such velocities, clamping cams 287 may be employed. The design of suitable cams is described below. For now, simply understand that at defined wafer rotational velocities, the clamping cams rotate into a position that locks wafer 224 in place.

Next note that a dispense-arm 283 functions to hold the dispense nozzle 256 and move the nozzle into an accurately controlled location over the wafer 224 during the etching step of the process. The dispense-arm design is not particularly restrictive. It can move down from above the wafer, in from the side, swing in from the edge, rotate down from above, or any combination of these movements. However, the location of the nozzle is preferably reproducibly accurate to within less than about 0.05 mm (more typically less than about 0.02 mm) so that the etched region is mechanically under control. Any suitable pneumatic actuator, solenoid, motor controlled gear, or servo controlled motor can activate the arm. The dispense-arm should move the dispense nozzle accurately to the edge of the wafer and move the nozzle out of the way to allow the wafer to be transferred into and out of the chuck. The materials of construction should be resistant to the particular chemical etching solution used. If the preferred etchant disclosed herein is used, certain stainless steels (e.g. 303, 625, 316L etc.), ceramics ($Al_2O_3$, zirconia), Tantalum, and plastic coated metals (polypropylene, polyethylene, PTFE, PVDF, PPS; polyphenylene sulfide) are good choices because they will resist chemical attack, and have sufficient mechanical strength (without creep or flow) to maintain the necessary stringent mechanical tolerances. Similar design considerations hold for the wafer chuck.

Figure 4A:
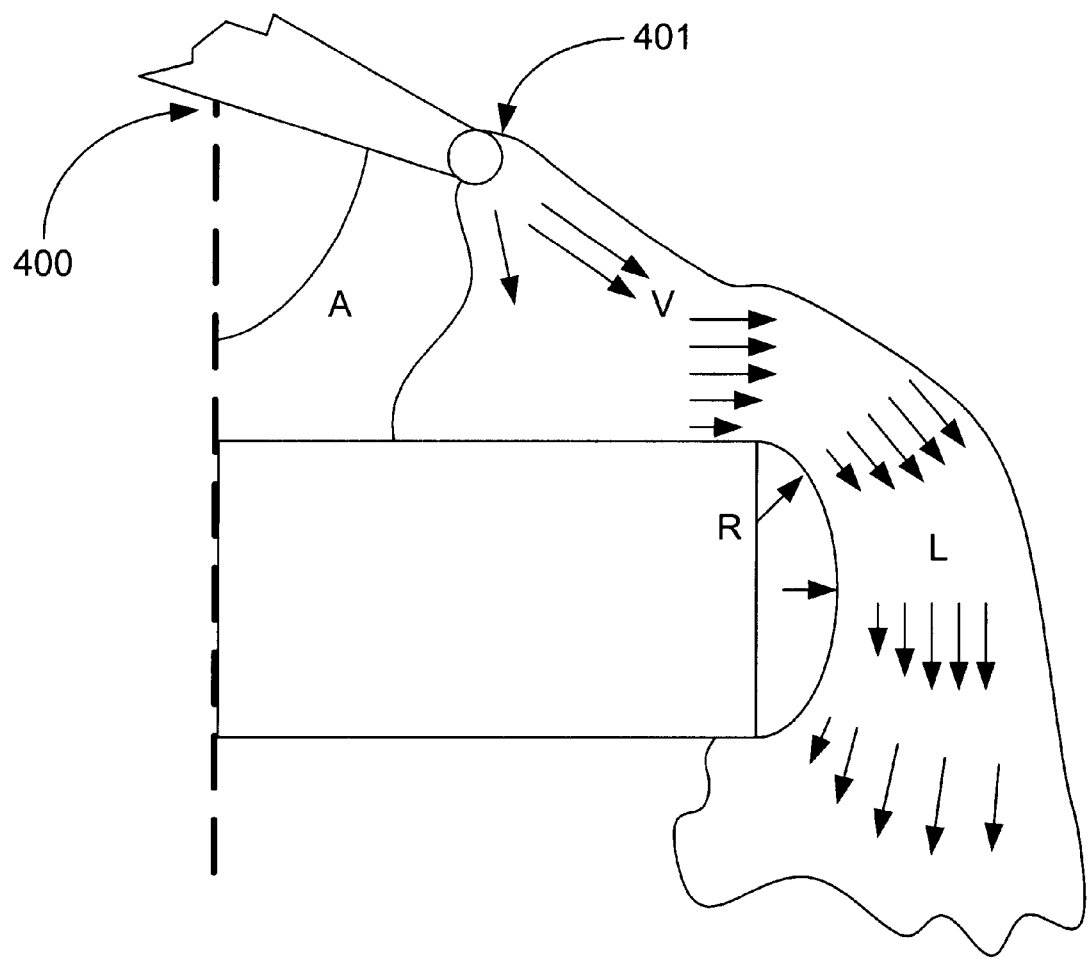
FIG. 4A is a schematic illustration of etchant being delivered to a wafer edge bevel via an etchant dispensing nozzle in a manner that constrains the etchant to the edge bevel region of the wafer.

FIG. 4A schematically shows a nozzle 400 delivering etchant to the front of the wafer for EBR. Relevant parameters for defining the desired etchant flow regime include (i) the thickness of the fluid stream (L), which is essentially determined by the diameter of the nozzle, (ii) the radius of curvature of the wafer (R), and (iii) the radial velocity of the fluid stream (V), which is determined by the radial component of the etchant's exit velocity from the nozzle and to some degree the centripetal acceleration from rotation of the wafer. In a plane containing the normal to the wafer, the nozzle 401 may be angled by A degrees (generally between about 30 to 70 degrees) with respect to the normal of the wafer. The component of the etchant's exit velocity from the slot nozzle in the plane of the wafer is thus the product of the total exit velocity and sin(A). The viscosity ($\mu$) and density ($\rho$) of the etchant fluid also contribute to the flow regime function. The nozzle also is angled rotationally at 0 to 90 degrees with respect to the wafer tangent in the plane of the wafer.

Figure 4B:
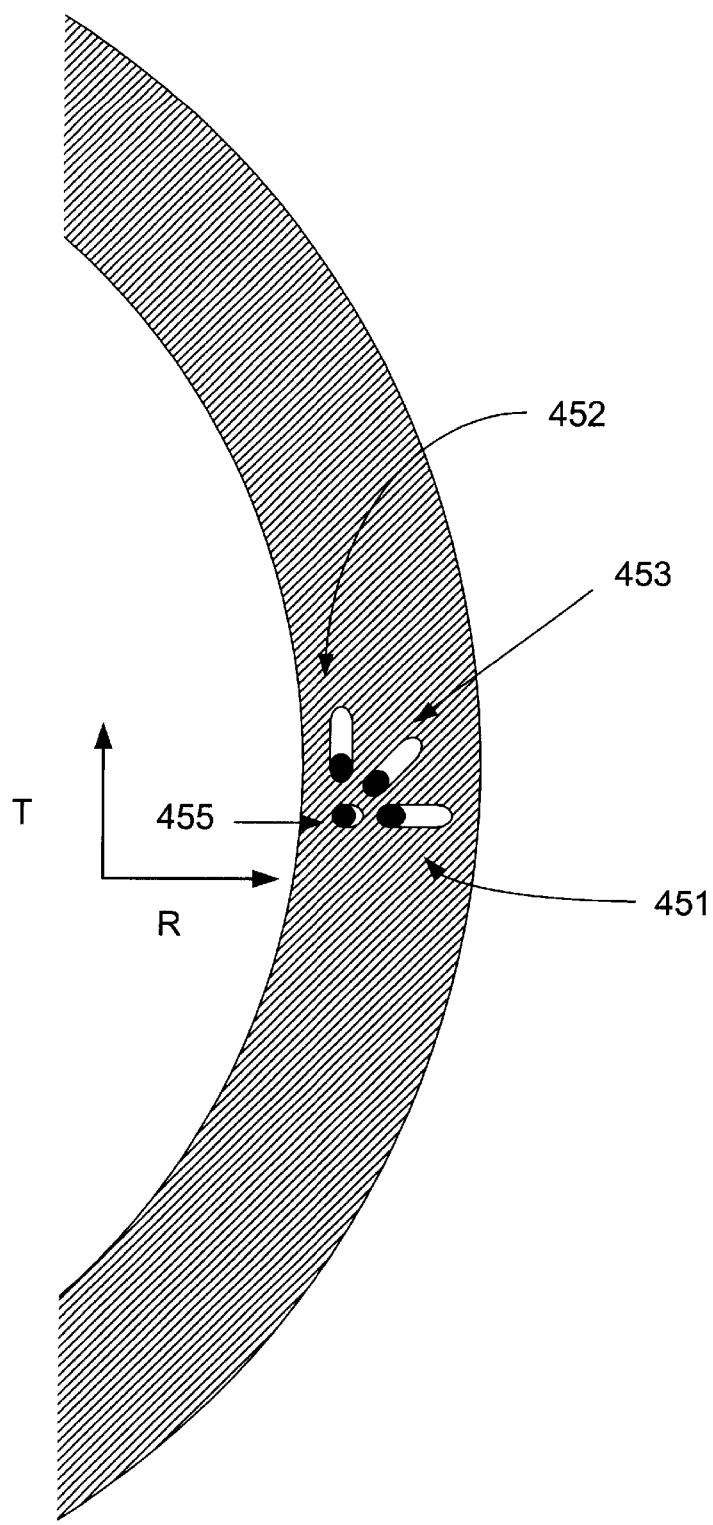
FIG. 4B is a top view of a wafer on which etchant is delivered at a controlled orientation via an etchant delivery nozzle.

FIG. 4B schematically shows a nozzle at four different orientations with respect to a wafer. Each orientation differs from the others in its angle with respect to the wafer's tangent and/or its angle with respect to the wafer's normal (the "z-direction" out of the plane of the page). Considering first the radial/tangential angle (in the plane of the wafer), if the nozzle is angled purely in the radial direction R (90 degrees with respect to the wafer tangent), then it will deliver etchant fluid with a radial angle as shown by nozzle 451. And if the nozzle is angled purely in the tangential direction T (0 degrees with respect to the wafer tangent), then it will deliver etchant fluid with a tangential angle as shown by nozzle 452. The nozzle can and often is angled somewhere between the purely radial and purely tangential directions as illustrated by nozzle 453. As explained, the nozzle orientation can also vary with respect to the wafer normal. Each of nozzles 451, 452, and 453 is angled to the same degree with respect to the wafer normal. Nozzle 455, however, is more steeply angled toward the normal.

As mentioned, the three flow regimes of interest include (i) edge beading, where surface tension forces dominate the behavior of the fluid, (ii) viscous flow, where viscous forces predominate, and (iii) inertial, where inertial forces predominate and the fluid tends to spray. Several experimental observations and calculated trends were made. Larger nozzles and high flow velocities lead to thicker fluid films with more inertia, which tend to fly off the edge of the wafer rather than wrap around the side and back. Combinations of low flow, low rotation, and a wide nozzle result in films that bead at the edge, and sporadically weep from the edge to the back, where they fly off in spurts. A high rotation rate results in very short etchant/surface exposure times and the etchant flying off the front surface (not wetting the sides and back). The experiments and calculations indicate that the thickness of the applied etchant stream should be approximately the same size or smaller than the radius of curvature of the wafer edge. There are a range of flow rates (fluid velocities) and rotation rate that are effective in producing the required viscous flow conditions. Generally, lower flow rates were effective with higher rotation rates and vice versa.

The three flow regimes can be approximately correlated to values of a dimensionless number given by $\mu R/VL^2\rho$. The parameters of this dimensionless number were discussed above in conjunction with FIG. 4A. Using this dimensionless number, numbers above about 0.001 correspond to the edge beading regime, numbers below about 0.0001 correspond to the inertial regime, and numbers in between these correspond to the viscous flow regime.

Edge beading is not desirable for practicing the invention because in this regime the fluid forms in droplets rather than evenly flowing over the surface of the wafer. In addition, the movement of such droplets is somewhat unpredictable, and they can flow in from the front edge of the wafer, where the fluid is dispensed from the nozzle, back toward the center. The inertial regime is undesirable because in this regime the fluid tends to "fly off" the front edge of the wafer, due to the radial component of the fluid's velocity, rather than flowing over the side edge. This radial velocity is a result of the exit velocity of the fluid from the nozzle and to a smaller degree the centripetal acceleration of the rotating wafer. The viscous regime is the regime one wishes to operate in because in this regime the fluid evenly covers the front edge of the wafer where the etchant is applied. The viscous fluid also flows over the side edge and to some degree the back edge of the wafer due to the radial component of the fluid's velocity.

Using typical etchant solutions, such as the preferred $H_2SO_4$ and $H_2O_2$ solution described below, it has generally been found that the thickness of the etchant stream as delivered to the wafer should be about the same size or slightly smaller than the radius of curvature of the wafer. Using the preferred etchant, and processing a standard wafer of 200 millimeters diameter, 0.75 millimeters thickness and 0.15 millimeter radius of curvature, the following parameters were found to have worked well: a nozzle diameter of between about 0.4 to 0.5 mm, a wafer rotation rate of between about 100 and 500 rpm, an exit velocity of between about 40 and 400 cm/sec, a angle for the nozzle of 30 to 70 degrees from the normal of the wafer, and a rotation angle for the nozzle of about 0 to 90 degrees with respect to the direction of rotation (the tangential direction, T, of FIG. 4B). It is generally desirable to have the nozzle located as close to the wafer as mechanically practical. Further, the location of the nozzle with respect to the wafer edge, combined with its location above the wafer, determines the etching region which is dependent on the particular application. It has been found that the EBR works well when the nozzle exit is about 0.3 to 5 millimeters above the surface of the wafer, and about 0 to 5 millimeters inside its outer edge. The nozzle tube generally should be narrow and long enough to ensure that the fluid exits in a stream that stays roughly parallel before it hits the wafer.

In particularly preferred embodiment, an angle of about 45 degrees from the normal (toward the edge of the wafer along a radial line) is used, and about 0–45 degrees radially in the direction of rotation (along a line parallel to the tangent of the wafer), more preferably 25–35 degrees, is used. In this case, the nozzle orifice is offset from the edge of the wafer by about 1.5 to 4.5 millimeters. This embodiment is particularly effective at eliminating streaking and reducing the taper of the wafer. The angular and translational positions of the nozzle can be controlled using conventional actuators, such as screw actuators.

The rotation rates specified herein were determined through experimentation and calculation, specifically for a 200 millimeter wafer part size and specific viscosity of etchant. However, the invention is not specific to that part size or etchant viscosity. Similar experiments and calculations can be performed to optimize the nozzle size, viscosity, flow conditions and rotation rates for other wafer sizes. The appropriate rotation rate for other size wafers can be estimated by maintaining the same centrifugal acceleration ($v^2/r$). Since the tangential velocity is $v=2\pi\omega r/60$ ($\omega$ is the rotation rate in rpm, r is the wafer radius in cm, v is the velocity in cm/sec), the centrifugal acceleration is given by $a_c=(2\pi\omega/60)^2 r$. Therefore, neglecting viscous forces and time of flight considerations, the appropriate scaling is therefore $r_1/r_2=\omega_2^2/\omega_1^2$.

The nozzle hole diameter should be optimized along with the flow velocity and rotation rate to apply a continuous film of fluid onto the wafer. Maintaining the nozzle hole diameter over a fixed potion of nozzle length is necessary to develop an approximately parallel (non-diverging) exiting fluid flow profile. The fluid nozzle impingement imparts a sufficiently large radial velocity component so that the fluid will rapidly flow around the wafer edge. Preferably, the nozzle shape is tubular. In a specific embodiment, the nozzle is tubular and about 0.5 to 1 millimeter in length.

In an alternative embodiment, the nozzle has a slot shape. If a slot nozzle is used, its length should be determined with reference to the width of the etched region (ring) that is to be produced. The slot width should be small enough so as to minimize chemical usage, splashing of etchant, and beading of the dispensing volume (avoiding the dispense having discrete drops rather than a stream). Typical slot nozzles tested that were found to be effective were about 2–4 millimeters in length, allowing application of etchant over 1–5 mm of the wafer edge. Useful slot widths were in the range of about 0.1–0.3 millimeters.

Keep in mind that a large tube (dispensing spray diameters approaching the dimensions of the edge to be etched) could be used, but would not be as efficient as the approaches described here because of the large amount of fluid needed. The use of the larger flow volume near the rotating chuck cams and arms also increases the propensity for splashing back onto the frontside device areas of the wafer as well. The disclosed design enables controlled dispensing of the etchant from the top of the wafer, over the side, to the back edge, and even controlled removal of the metal from the underside edge of the wafer, without physically touching the wafer and thereby contacting the active surface.

Various considerations influence the choice of a liquid etchant. As mentioned above, the liquid etchant should etch the unwanted metal rapidly at room temperature (e.g., >400 Å/sec). But, it should not aggressively attack the mechanical and electrical components of the etch system. Nor should it generate dangerous by-products during the etching reaction. Preferably, the components of the liquid etchant should include only those materials readily available in normal integrated circuit manufacturing facilities. Other beneficial properties of a liquid etchant include a long shelf life (preferably without stabilizers), a consistent etching rate over time, low cost, and environmental friendliness. In cases where the use of the particular etchant chemical(s) are either expense as a raw material or where the treatment of waste must be minimized, use of heated etchant can be useful. For example, etch rates of a 5% $H_2O_2$ and 5% $H_2SO_4$ can be increased approximately 2× for every 10 degrees C. in the range of 20 to 50 C. Use of an in line heater after the components have been in-line mixed can enable increased etch rates with relatively low concentrations of chemical and avoid the normally high rate of etchant breakdown (stability) if it were stored in the mixed form at a elevated temperature. In short, one aspect of the invention involves (1) storing the chemicals at ambient temperature (relatively cold), (2) mixing them cold, (3) heating them after they are mixed just prior to delivery, and then (4) applying them to the wafer to enable accelerated etch rate capability. Preferably, the liquid etchant includes an acid and oxidizer. Examples of acids that are useful include sulfuric acid, hydrohalic acids, chromic acid and nitric acid. A preferred etchant for copper EBR is a solution of $H_2SO_4$ (sulfuric acid) and $H_2O_2$ (hydrogen peroxide) in water. A preferred composition of the etchant is 1.4% to 10% $H_2SO_4$ by weight (preferably 2.5% to 7.5%) and 3.5% to 7.5% $H_2O_2$ by weight (preferably 3.5% to 6.5%).

It has been found that this relatively dilute mixture of hydrogen peroxide and sulfuric acid provides an etchant with an excellent rate of copper etch. In storage, the etchant maintains a sufficiently high etch rate for over a month. Alternatively, dilute (about 2–15% by weight) acid and peroxide can be stored in separate containers and mixed in a small tank for short-term storage prior to use, or mixed on-line just prior to their use. In this case the etch rate is found to not change for over a year (the normal degradation rate of commercially available stabalized hydrogen peroxide). There is an exothermic release with the mixing of dilute (~10%/wt) acid and peroxide, but it is small at these dilute concentrations. Either of these mixing approaches is effective and preferred, since sulfuric acid is a stable compound, and low concentration hydrogen peroxide (e.g., <10%) can be safely stored for over a year with stabilizers well-known in the art. A system and method for in-line mixing and delivery of this preferred etchant is described in U.S. patent application Ser. No. 09/557,695, previously incorporated by reference. Processing of the etchant after use is not difficult and is generally compatible with waste-treatment methods that are used to process copper electro-plating solutions as well.

While sulfuric acid and hydrogen peroxide work well in these capacities, the invention is not so limited. Note that if an oxidant other than hydrogen peroxide is used, some of the precautions described herein against generating oxygen bubbles can be eliminated. Also, if an acid other than sulfuric acid is used, some of the precautions against the exothermic mixing reaction can be eliminated. Two possible, but less preferred, etchant includes $S_2O_8^{-2}$ (peroxydisulfate) and concentrated $HNO_3$ (~30% in water), which is described in U.S. Pat. No. 5,486,234, which is herein incorporated by reference in its entirety.

Generally, the liquid etchant should have physical properties compatible with the etching system. The viscosity and density should allow easy delivery onto the semiconductor wafer in a desired flow regime (e.g., a viscous flow regime). It has been found that the fluid properties of the most effective etchants are very similar to those of water (e.g., surface tension, contact angle, and viscosity). The above-described dilute sulfuric acid/hydrogen peroxide etchant meets this requirement.

What is claimed is:

1. A method of removing unwanted metal deposited on an edge bevel area of a semiconductor wafer, the method comprising:
   rotating the wafer;
   prerinsing the wafer using deionized water and and acid; and
   delivering a stream of liquid etchant onto the edge of the rotating wafer such that the liquid etchant selectively flows over the edge bevel area while in the viscous flow regime,
   wherein the liquid etchant substantially removes unwanted metal selectively from the edge bevel area.

2. The method of claim 1, wherein the stream of liquid etchant is delivered onto the edge of the rotating wafer without substantially contacting any region of the wafer inside of the edge bevel area.

3. The method of claim 1, wherein the liquid etchant is delivered from a nozzle positioned proximate to the edge of the rotating wafer.

4. The method of claim 3, wherein the nozzle is pointed so that delivery of the liquid etchant has an angular component in the direction of rotation of the wafer edge of about 45 degrees.

5. The method of claim 3, wherein the nozzle is pointed so that delivery of the liquid etchant has a radial component away from the center of the wafer and toward the edge of the wafer of about 25–35 degrees.

6. The method of claim 1 wherein the wafer is rotated at about 150–400 rpm.

7. The method of claim 1 wherein the wafer is rotated at about 225 rpm.

8. The method of claim 1 wherein the wafer is rotated at about 350 rpm.

9. The method of claim 1 wherein the taper width of the wafer is reduced to less than about 300 micrometers.

10. The method of claim 1 wherein the acid is $H_2SO_4$.

11. The method of claim 1 wherein the metal is copper.

12. The method of claim 1 wherein the metal is removed at a rate of at least 400 Å per second.

13. The method of claim 1, wherein the liquid etchant is delivered from a nozzle having an orifice diameter of about 0.016 inches.

14. The method of claim 1, further comprising:
   (a) storing hydrogen peroxide and sulfuric acid at a first temperature that is ambient or approximately ambient;
   (b) mixing the hydrogen peroxide and sulfuric acid;
   (c) heating the mixed hydrogen peroxide and sulfuric acid to produce the liquid etchant, wherein the liquid etchant is delivered to the edge bevel area at an elevated temperature to thereby enable accelerated etch rate.

15. A method of removing unwanted metal deposited on an edge bevel area of a semiconductor wafer, the method comprising:
   rotating the wafer;
   prerinsing the wafer using deionized water and acid; and
   delivering a stream of liquid etchant onto the edge of the rotating wafer such that the liquid etchant selectively flows over the edge bevel area to substantially remove unwanted metal selectively from the edge bevel area.

16. The method of claim 15, wherein the liquid etchant is delivered from a nozzle having an orifice diameter of about 0.016 inches.

17. The method of claim 15, wherein the prerinsing comprises:
   (i) delivering only water to the wafer surface;
   (ii) delivering water and acid to the wafer surface; and
   (iii) delivering only water to the wafer surface.

18. The method of claim 17, wherein the water is deionized water.

19. The method of claim 17, wherein (i) comprises delivering about 400–1000 ml/minute of water per nozzle for about 2–4 seconds.

20. The method of claim 17, wherein (iii) comprises delivering about 400–1200 ml/minute of water for about 2–4 seconds.

21. The method of claim 17, wherein (ii) comprises delivering about 0.5 to 2 ml of 4–6% sulfuric acid for about 0.1 to 2 seconds, while concurrently delivering water.

22. The method of claim 15 wherein the wafer is rotated at about 150–400 rpm.

23. The method of claim 15 wherein the wafer is rotated at about 225 rpm.

24. The method of claim 15 wherein the wafer is rotated at about 350 rpm.

25. The method of claim 15 wherein the acid is $H_2SO_4$.

26. The method of claim 15 wherein the metal is copper.

27. The method of claim 15, further comprising:
   (a) storing hydrogen peroxide and sulfuric acid at a first temperature that is ambient or approximately ambient;
   (b) mixing the hydrogen peroxide and sulfuric acid;
   (c) heating the mixed hydrogen peroxide and sulfuric acid to produce the liquid etchant, wherein the liquid etchant is delivered to the edge bevel area at an elevated temperature to thereby enable accelerated etch rate.

* * * * *